(12) United States Patent
Wieting (10) Patent No.: US 8,557,625 B1
(45) Date of Patent: Oct. 15, 2013

(54) ZINC OXIDE FILM METHOD AND STRUCTURE FOR CIGS CELL

(75) Inventor: Robert D. Wieting, San Jose, CA (US)

(73) Assignee: Stion Corporation, San Jose, CA (US)

( * ) Notice: Subject to any disclaimer, the term of this patent is extended or adjusted under 35 U.S.C. 154(b) by 0 days.

(21) Appl. No.: 13/371,239

(22) Filed: Feb. 10, 2012

Related U.S. Application Data (63) Continuation of application No. 12/577,132, filed on Oct. 9, 2009, now Pat. No. 8,168,463.

(60) Provisional application No. 61/106,158, filed on Oct. 17, 2008.

(51) Int. Cl.
*H01L 21/00* (2006.01)

(52) U.S. Cl.
USPC .......... 438/61; 438/48; 438/98; 257/E21.168; 257/E31.001; 257/E31.007

(58) Field of Classification Search
USPC ........ 438/48, 61, 98; 257/751, 763, E21.168, 257/E31.007
See application file for complete search history.

(56) References Cited

U.S. PATENT DOCUMENTS

| | | | |
|---|---|---|---|
| 3,520,732 A | 7/1970 | Nakayama et al. | |
| 3,828,722 A | 8/1974 | Reuter et al. | |
| 3,975,211 A | 8/1976 | Shirland | |
| 4,062,038 A | 12/1977 | Cuomo et al. | |
| 4,263,336 A | 4/1981 | Thompson et al. | |
| 4,332,974 A | 6/1982 | Fraas | |
| 4,335,266 A | 6/1982 | Mickelsen et al. | |
| 4,441,113 A | 4/1984 | Madan | |
| 4,442,310 A | 4/1984 | Carlson et al. | |
| 4,461,922 A | 7/1984 | Gay et al. | |
| 4,465,575 A | 8/1984 | Love et al. | |
| 4,471,155 A | 9/1984 | Mohr et al. | |

(Continued)

FOREIGN PATENT DOCUMENTS

| | | |
|---|---|---|
| AU | 1998/78651 B2 | 2/1999 |
| AU | 2001/40599 A1 | 8/2001 |

(Continued)

OTHER PUBLICATIONS

Baumann, A., et al., Photovoltaic Technology Review, presentation Dec. 6, 2004, 18 pages.

(Continued)

*Primary Examiner* — Charles Garber
*Assistant Examiner* — Abdulfattah Mustapha
(74) *Attorney, Agent, or Firm* — Kilpatrick Townsend & Stockton LLP (57) ABSTRACT

A method for fabricating a thin film photovoltaic device. The method includes providing a substrate comprising an absorber layer and an overlying window layer. The substrate is loaded into a chamber and subjected to a vacuum environment. The vacuum environment is at a pressure ranging from 0.1 Torr to about 0.02 Torr. In a specific embodiment, a mixture of reactant species derived from diethylzinc species, water species and a carrier gas is introduced into the chamber. The method further introduces a diborane species using a selected flow rate into the mixture of reactant species. A zinc oxide film is formed overlying the window layer to define a transparent conductive oxide using the selected flow rate to provide a resistivity of about 2.5 milliohm-cm and less and an average grain size of about 3000 to 5000 Angstroms.

20 Claims, 3 Drawing Sheets

(56) References Cited

U.S. PATENT DOCUMENTS

| | | |
|---|---|---|
| 4,499,658 A | 2/1985 | Lewis |
| 4,507,181 A | 3/1985 | Nath et al. |
| 4,517,403 A | 5/1985 | Morel et al. |
| 4,518,855 A | 5/1985 | Malak |
| 4,532,372 A | 7/1985 | Nath et al. |
| 4,542,255 A | 9/1985 | Tanner et al. |
| 4,581,108 A | 4/1986 | Kapur et al. |
| 4,589,194 A | 5/1986 | Roy |
| 4,598,306 A | 7/1986 | Nath et al. |
| 4,599,154 A | 7/1986 | Bender et al. |
| 4,611,091 A | 9/1986 | Choudary et al. |
| 4,623,601 A | 11/1986 | Lewis et al. |
| 4,625,070 A | 11/1986 | Berman et al. |
| 4,638,111 A | 1/1987 | Gay |
| 4,661,370 A | 4/1987 | Tarrant |
| 4,663,495 A | 5/1987 | Berman et al. |
| 4,705,912 A | 11/1987 | Nakashima et al. |
| 4,724,011 A | 2/1988 | Turner et al. |
| 4,727,047 A | 2/1988 | Bozler et al. |
| 4,751,149 A | 6/1988 | Vijayakumar et al. |
| 4,775,425 A | 10/1988 | Guha et al. |
| 4,793,283 A | 12/1988 | Sarkozy |
| 4,798,660 A | 1/1989 | Ermer et al. |
| 4,816,082 A | 3/1989 | Guha et al. |
| 4,816,420 A | 3/1989 | Bozler et al. |
| 4,837,182 A | 6/1989 | Bozler et al. |
| 4,865,999 A | 9/1989 | Xi et al. |
| 4,873,118 A | 10/1989 | Elias et al. |
| 4,915,745 A | 4/1990 | Pollock et al. |
| 4,950,615 A | 8/1990 | Basol et al. |
| 4,968,354 A | 11/1990 | Nishiura et al. |
| 4,996,108 A | 2/1991 | Divigalpitiya et al. |
| 5,008,062 A | 4/1991 | Anderson et al. |
| 5,011,565 A | 4/1991 | Dube et al. |
| 5,028,274 A | 7/1991 | Basol et al. |
| 5,039,353 A | 8/1991 | Schmitt |
| 5,045,409 A | 9/1991 | Eberspacher et al. |
| 5,069,727 A | 12/1991 | Kouzuma et al. |
| 5,078,803 A | 1/1992 | Pier et al. |
| 5,125,984 A | 6/1992 | Kruehler et al. |
| 5,133,809 A | 7/1992 | Sichanugrist et al. |
| 5,137,835 A | 8/1992 | Karg |
| 5,154,777 A | 10/1992 | Blackmom et al. |
| 5,180,686 A | 1/1993 | Banerjee et al. |
| 5,211,824 A | 5/1993 | Knapp |
| 5,217,564 A | 6/1993 | Bozler et al. |
| 5,231,047 A | 7/1993 | Ovshinsky et al. |
| 5,248,345 A | 9/1993 | Sichanugrist et al. |
| 5,259,883 A | 11/1993 | Yamabe et al. |
| 5,261,968 A | 11/1993 | Jordan |
| 5,298,086 A | 3/1994 | Guha et al. |
| 5,336,623 A | 8/1994 | Sichanugrist et al. |
| 5,346,853 A | 9/1994 | Guha et al. |
| 5,397,401 A | 3/1995 | Toma et al. |
| 5,399,504 A | 3/1995 | Ohsawa |
| 5,436,204 A | 7/1995 | Albin et al. |
| 5,445,847 A | 8/1995 | Wada |
| 5,474,939 A | 12/1995 | Pollock et al. |
| 5,501,744 A | 3/1996 | Albright et al. |
| 5,512,107 A | 4/1996 | Van den Berg |
| 5,528,397 A | 6/1996 | Zavracky et al. |
| 5,536,333 A | 7/1996 | Foote et al. |
| 5,578,103 A | 11/1996 | Araujo et al. |
| 5,578,503 A | 11/1996 | Karg et al. |
| 5,622,634 A | 4/1997 | Noma et al. |
| 5,626,688 A | 5/1997 | Probst et al. |
| 5,665,175 A | 9/1997 | Safir |
| 5,676,766 A | 10/1997 | Probst et al. |
| 5,726,065 A | 3/1998 | Szlufcik et al. |
| 5,738,731 A | 4/1998 | Shindo et al. |
| 5,858,819 A | 1/1999 | Miyasaka |
| 5,868,869 A | 2/1999 | Albright et al. |
| 5,977,476 A | 11/1999 | Guha et al. |
| 5,981,868 A | 11/1999 | Kushiya et al. |
| 5,985,691 A * | 11/1999 | Basol et al. .................. 438/95 |
| 6,040,521 A | 3/2000 | Kushiya et al. |
| 6,048,442 A | 4/2000 | Kushiya et al. |
| 6,092,669 A | 7/2000 | Kushiya et al. |
| 6,107,562 A | 8/2000 | Hashimoto et al. |
| 6,127,202 A | 10/2000 | Kapur et al. |
| 6,160,215 A | 12/2000 | Curtin |
| 6,166,319 A | 12/2000 | Matsuyama |
| 6,172,297 B1 | 1/2001 | Hezel et al. |
| 6,258,620 B1 | 7/2001 | Morel et al. |
| 6,294,274 B1 | 9/2001 | Kawazoe et al. |
| 6,307,148 B1 | 10/2001 | Takeuchi et al. |
| 6,323,417 B1 | 11/2001 | Gillespie et al. |
| 6,328,871 B1 | 12/2001 | Ding et al. |
| 6,361,718 B1 | 3/2002 | Shinmo et al. |
| 6,372,538 B1 | 4/2002 | Wendt et al. |
| 6,423,565 B1 | 7/2002 | Barth et al. |
| 6,632,113 B1 | 10/2003 | Noma et al. |
| 6,635,307 B2 | 10/2003 | Huang et al. |
| 6,653,701 B1 | 11/2003 | Yamazaki et al. |
| 6,667,492 B1 | 12/2003 | Kendall |
| 6,690,041 B2 | 2/2004 | Armstrong et al. |
| 6,692,820 B2 | 2/2004 | Forrest et al. |
| 6,784,492 B1 | 8/2004 | Morishita |
| 6,852,920 B2 | 2/2005 | Sager et al. |
| 6,878,871 B2 | 4/2005 | Scher et al. |
| 6,974,976 B2 | 12/2005 | Hollars |
| 7,122,398 B1 | 10/2006 | Pichler |
| 7,179,677 B2 | 2/2007 | Ramanathan et al. |
| 7,194,197 B1 | 3/2007 | Wendt et al. |
| 7,220,321 B2 | 5/2007 | Barth et al. |
| 7,235,736 B1 | 6/2007 | Buller et al. |
| 7,252,923 B2 | 8/2007 | Kobayashi |
| 7,265,037 B2 | 9/2007 | Yang et al. |
| 7,319,190 B2 | 1/2008 | Tuttle |
| 7,364,808 B2 | 4/2008 | Sato et al. |
| 7,442,413 B2 | 10/2008 | Zwaap et al. |
| 7,544,884 B2 | 6/2009 | Hollars |
| 7,736,755 B2 | 6/2010 | Igarashi et al. |
| 7,741,560 B2 | 6/2010 | Yonezawa |
| 7,855,089 B2 | 12/2010 | Farris, III et al. |
| 7,863,074 B2 | 1/2011 | Wieting |
| 7,910,399 B1 | 3/2011 | Wieting |
| 7,955,891 B2 | 6/2011 | Wieting |
| 7,960,204 B2 | 6/2011 | Lee |
| 7,993,954 B2 | 8/2011 | Wieting |
| 7,993,955 B2 | 8/2011 | Wieting |
| 7,998,762 B1 | 8/2011 | Lee et al. |
| 8,003,430 B1 | 8/2011 | Lee |
| 8,008,110 B1 | 8/2011 | Lee |
| 8,008,111 B1 | 8/2011 | Lee |
| 8,008,112 B1 | 8/2011 | Lee |
| 8,017,860 B2 | 9/2011 | Lee |
| 8,142,521 B2 | 3/2012 | Wieting |
| 8,168,463 B2 | 5/2012 | Wieting |
| 8,178,370 B2 | 5/2012 | Lee et al. |
| 8,183,066 B2 | 5/2012 | Lee et al. |
| 8,217,261 B2 | 7/2012 | Wieting |
| 2002/0002992 A1 | 1/2002 | Kariya et al. |
| 2002/0004302 A1 | 1/2002 | Fukumoto et al. |
| 2002/0061361 A1 | 5/2002 | Nakahara et al. |
| 2002/0063065 A1 | 5/2002 | Sonoda et al. |
| 2003/0062065 A1 * | 4/2003 | Kanzaki ..................... 250/338.1 |
| 2003/0075717 A1 | 4/2003 | Kondo et al. |
| 2003/0089899 A1 | 5/2003 | Lieber et al. |
| 2003/0188777 A1 | 10/2003 | Gaudiana et al. |
| 2003/0230338 A1 | 12/2003 | Menezes |
| 2004/0063320 A1 | 4/2004 | Hollars |
| 2004/0084080 A1 | 5/2004 | Sager et al. |
| 2004/0095658 A1 | 5/2004 | Buretea et al. |
| 2004/0110393 A1 | 6/2004 | Munzer et al. |
| 2004/0187917 A1 | 9/2004 | Pichler |
| 2004/0245912 A1 | 12/2004 | Thurk et al. |
| 2004/0252488 A1 | 12/2004 | Thurk |
| 2004/0256001 A1 | 12/2004 | Mitra et al. |
| 2005/0074915 A1 | 4/2005 | Tuttle et al. |
| 2005/0098205 A1 | 5/2005 | Roscheisen et al. |
| 2005/0109392 A1 | 5/2005 | Hollars |
| 2005/0164432 A1 | 7/2005 | Lieber et al. |
| 2005/0194036 A1 | 9/2005 | Basol |

(56) References Cited

U.S. PATENT DOCUMENTS

| | | |
|---|---|---|
| 2005/0287717 A1 | 12/2005 | Heald et al. |
| 2006/0034065 A1 | 2/2006 | Thurk |
| 2006/0040103 A1 | 2/2006 | Whiteford et al. |
| 2006/0051505 A1 | 3/2006 | Kortshagen et al. |
| 2006/0096536 A1 | 5/2006 | Tuttle |
| 2006/0096537 A1 | 5/2006 | Tuttle |
| 2006/0096635 A1 | 5/2006 | Tuttle |
| 2006/0102230 A1 | 5/2006 | Tuttle |
| 2006/0112983 A1 | 6/2006 | Parce et al. |
| 2006/0130890 A1 | 6/2006 | Hantschel et al. |
| 2006/0160261 A1 | 7/2006 | Sheats et al. |
| 2006/0173113 A1 | 8/2006 | Yabuta et al. |
| 2006/0174932 A1 | 8/2006 | Usui et al. |
| 2006/0219288 A1 | 10/2006 | Tuttle |
| 2006/0219547 A1 | 10/2006 | Tuttle |
| 2006/0220059 A1 | 10/2006 | Satoh et al. |
| 2006/0249202 A1 | 11/2006 | Yoo et al. |
| 2006/0267054 A1 | 11/2006 | Martin et al. |
| 2007/0006914 A1 | 1/2007 | Lee |
| 2007/0089782 A1 | 4/2007 | Scheuten et al. |
| 2007/0116892 A1 | 5/2007 | Zwaap |
| 2007/0116893 A1 | 5/2007 | Zwaap |
| 2007/0151596 A1 | 7/2007 | Nasuno et al. |
| 2007/0163643 A1 | 7/2007 | Van Duren et al. |
| 2007/0169810 A1 | 7/2007 | Van Duren et al. |
| 2007/0193623 A1 | 8/2007 | Krasnov |
| 2007/0209700 A1 | 9/2007 | Yonezawa et al. |
| 2007/0264488 A1 | 11/2007 | Lee |
| 2007/0283998 A1 | 12/2007 | Kuriyagawa et al. |
| 2007/0289624 A1 | 12/2007 | Kuriyagawa et al. |
| 2008/0029154 A1 | 2/2008 | Mishtein et al. |
| 2008/0032044 A1 | 2/2008 | Kuriyagawa et al. |
| 2008/0041446 A1 | 2/2008 | Wu et al. |
| 2008/0057616 A1 | 3/2008 | Robinson et al. |
| 2008/0092945 A1 | 4/2008 | Munteanu et al. |
| 2008/0092953 A1 | 4/2008 | Lee |
| 2008/0092954 A1 | 4/2008 | Choi |
| 2008/0105294 A1 | 5/2008 | Kushiya et al. |
| 2008/0110491 A1 | 5/2008 | Buller et al. |
| 2008/0110495 A1 | 5/2008 | Onodera et al. |
| 2008/0121264 A1 | 5/2008 | Chen et al. |
| 2008/0121277 A1 | 5/2008 | Robinson et al. |
| 2008/0204696 A1 | 8/2008 | Kamijima |
| 2008/0210303 A1 | 9/2008 | Lu et al. |
| 2008/0280030 A1 | 11/2008 | Van Duren et al. |
| 2008/0283389 A1 | 11/2008 | Aoki' |
| 2009/0021157 A1 | 1/2009 | Kim et al. |
| 2009/0058295 A1 | 3/2009 | Auday et al. |
| 2009/0087940 A1 | 4/2009 | Kushiya |
| 2009/0087942 A1 | 4/2009 | Meyers |
| 2009/0145746 A1 | 6/2009 | Hollars |
| 2009/0217969 A1 | 9/2009 | Matsushima et al. |
| 2009/0234987 A1 | 9/2009 | Lee et al. |
| 2009/0235983 A1 | 9/2009 | Girt et al. |
| 2009/0235987 A1 | 9/2009 | Akhtar et al. |
| 2009/0293945 A1 | 12/2009 | Peter |
| 2010/0081230 A1 | 4/2010 | Lee |
| 2010/0087016 A1 | 4/2010 | Britt et al. |
| 2010/0087026 A1 | 4/2010 | Winkeler et al. |
| 2010/0096007 A1 | 4/2010 | Mattmann et al. |
| 2010/0101648 A1 | 4/2010 | Morooka et al. |
| 2010/0101649 A1 | 4/2010 | Huignard et al. |
| 2010/0122726 A1 | 5/2010 | Lee |
| 2010/0197051 A1 | 8/2010 | Schlezinger et al. |
| 2010/0210064 A1 | 8/2010 | Hakuma et al. |
| 2010/0233386 A1 | 9/2010 | Krause et al. |
| 2010/0258179 A1 | 10/2010 | Wieting |
| 2010/0267190 A1 | 10/2010 | Hakuma et al. |
| 2011/0018103 A1 | 1/2011 | Wieting |
| 2011/0020980 A1 | 1/2011 | Wieting |
| 2011/0070682 A1 | 3/2011 | Wieting |
| 2011/0070683 A1 | 3/2011 | Wieting |
| 2011/0070684 A1 | 3/2011 | Wieting |
| 2011/0070685 A1 | 3/2011 | Wieting |
| 2011/0070686 A1 | 3/2011 | Wieting |
| 2011/0070687 A1 | 3/2011 | Wieting |
| 2011/0070688 A1 | 3/2011 | Wieting |
| 2011/0070689 A1 | 3/2011 | Wieting |
| 2011/0070690 A1 | 3/2011 | Wieting |
| 2011/0071659 A1 | 3/2011 | Farris, III et al. |
| 2011/0073181 A1 | 3/2011 | Wieting |
| 2011/0203634 A1 | 8/2011 | Wieting |
| 2011/0212565 A1 | 9/2011 | Wieting |
| 2011/0259395 A1 | 10/2011 | Wieting et al. |
| 2011/0259413 A1 | 10/2011 | Wieting et al. |
| 2011/0269260 A1 | 11/2011 | Buquing |
| 2011/0277836 A1 | 11/2011 | Lee |
| 2012/0003789 A1 | 1/2012 | Doering et al. |
| 2012/0018828 A1 | 1/2012 | Shao |
| 2012/0021552 A1 | 1/2012 | Alexander et al. |
| 2012/0094432 A1 | 4/2012 | Wieting |
| 2012/0122304 A1 | 5/2012 | Wieting |
| 2012/0186975 A1 | 7/2012 | Lee et al. |

FOREIGN PATENT DOCUMENTS

| | | |
|---|---|---|
| DE | 3314197 A1 | 11/1983 |
| DE | 10104726 A1 | 8/2002 |
| DE | 102005062977 B3 | 9/2007 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270871 | 9/2002 |
| JP | 2002/299670 | 10/2002 |
| JP | 2004/332043 | 11/2004 |
| JP | 2005/311292 | 11/2005 |
| WO | 01/57932 A1 | 8/2001 |
| WO | 2005/011002 | 2/2005 |
| WO | 2006/126598 A1 | 11/2006 |
| WO | 2007/022221 A2 | 2/2007 |
| WO | 2007/077171 A2 | 7/2007 |
| WO | 2008/025326 A2 | 3/2008 |

OTHER PUBLICATIONS

Chopra et al., "Thin-Film Solar Cells: An Overview", 2004, Progress in Photovoltaics: Research and Applications, 2004, vol. 12, pp. 69-92.

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

Guillen C., "CuInS2 Thin Films Grown Sequentially from Binary Sulfides as Compared to Layers Evaporated Directly from the Elements", Semiconductor Science and Technology, vol. 21, No. 5, May 2006, pp. 709-712.

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of $ZnxCd1_xS$ Nanocomposites in Polymer Matrices and their Photophysical Properties, Langmuir 1998, 14, pp. 4342-4344.

International Solar Electric Technology, Inc. (ISET) "Thin Film CIGS", Retrieved from http://www.isetinc.com/cigs.html on Oct. 1, 2008, 4 pages.

Kapur et al., "Fabrication of CIGS Solar Cells via Printing of Nanoparticle Precursor Inks", DOE Solar Program Review Meeting 2004, DOE/GO-102005-2067, p. 135-136.

Kapur et al., "Non-Vacuum Printing Process for CIGS Solar Cells on Rigid and Flexible Substrates", 29th IEEE Photovoltaic Specialists Conf., New Orleans, LA, IEEE, 2002, pp. 688-691.

Kapur et al., "Non-Vacuum Processing of CIGS Solar Cells on Flexible Polymer Substrates", Proceedings of the Third World Conference on Photovoltaic Energy Conversion, Osaka, Japan, 2P-D3-43, 2003.

Kapur et al., "Non-Vacuum Processing of $CuIn_{1-x}GaxSe_2$ Solar Cells on Rigid and Flexible Substrates using Nanoparticle Precursor Inks", Thin Solid Films, 2003, vol. 431-432, pp. 53-57.

(56) References Cited

OTHER PUBLICATIONS

Kapur et al., "Fabrication of Light Weight Flexible CIGS Solar Cells for Space Power Applications", Materials Research Society, Proceedings vol. 668, (2001) pp. H3.5.1-H3.5.6.

Kapur et al., "Nanoparticle Oxides Precursor Inks for Thin Film Copper Indium Gallium Selenide (CIGS) Solar Cells", Materials Research Society Proceedings, vol. 668, (2001) pp. H2.6.1-H2.6.7.

Mehta et al., "A graded diameter and oriented nanorod-thin film structure for solar cell application: a device proposal", Solar Energy Materials & Solar Cells, 2005, vol. 85, pp. 107-113.

Onuma et al., Preparation and Characterization of CuInS2 Thin Films Solar Cells with Large Grain, Elsevier Science B.V; Solar Energy Materials & Solar Cells 69 (2001) pp. 261-269.

Salvador, "Hole diffusion length in n-TiO2 single crystals and sintered electrodes: photoelectrochemical determination and comparative analysis," Journa; of Applied Physics, vol. 55, No. 8, pp. 2977-2985, Apr. 15, 1984.

Srikant V., et al., "On the Optical Band Gap of Zinc Oxide", Journal of Applied Physics, vol. 83, No. 10, May 15, 1998, pp. 5447-5451.

Yang et al., "Preparation, Characterization and Electroluminescence of ZnS Nanocrystals in a Polymer Matrix", Journal Material Chem., 1997, vol. 7, No. 1, pp. 131-133.

Yang et al., "Electroluminescence from ZnS/CdS Nanocrystals/Polymer Composite", Synthetic Metals 1997, vol. 91, pp. 347-349.

Yang et al., "Fabrication and Characteristics of ZnS Nanocrystals/Polymer Composite Doped with Tetraphenylbenzidine Single Layer Structure Light-emitting Diode", Applied Physics Letters, vol. 69, No. 3, Jul. 15, 1996, pp. 377-379.

\* cited by examiner

ZINC OXIDE FILM METHOD AND STRUCTURE FOR CIGS CELL

CROSS-REFERENCES TO RELATED APPLICATIONS

This application is a continuation of U.S. patent application Ser. No. 12/577,132 filed Oct. 9, 2009, which claims priority to U.S. Provisional Application No. 61/106,158 filed Oct. 17, 2008, commonly assigned, and incorporated by reference in its entirety herein for all purpose.

BACKGROUND OF THE INVENTION

The present invention relates generally to photovoltaic materials and manufacturing method. More particularly, the present invention provides a method and structure for a thin film photovoltaic cell. Merely by way of example, the present method and structure provide for a thin film photovoltaic cell using an absorber material comprising a copper indium disulfide species.

From the beginning of time, mankind has been challenged to find way of harnessing energy. Energy comes in the forms such as petrochemical, hydroelectric, nuclear, wind, biomass, solar, and more primitive forms such as wood and coal. Over the past century, modern civilization has relied upon petrochemical energy as an important energy source. Petrochemical energy includes gas and oil. Gas includes lighter forms such as butane and propane, commonly used to heat homes and serve as fuel for cooking Gas also includes gasoline, diesel, and jet fuel, commonly used for transportation purposes. Heavier forms of petrochemicals can also be used to heat homes in some places. Unfortunately, the supply of petrochemical fuel is limited and essentially fixed based upon the amount available on the planet Earth. Additionally, as more people use petroleum products in growing amounts, it is rapidly becoming a scarce resource, which will eventually become depleted over time.

More recently, environmentally clean and renewable sources of energy have been desired. An example of a clean source of energy is hydroelectric power. Hydroelectric power is derived from electric generators driven by the flow of water produced by dams such as the Hoover Dam in Nevada. The electric power generated is used to power a large portion of the city of Los Angeles in California. Clean and renewable sources of energy also include wind, waves, biomass, and the like. That is, windmills convert wind energy into more useful forms of energy such as electricity. Still other types of clean energy include solar energy. Specific details of solar energy can be found throughout the present background and more particularly below.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation into electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. Similar limitations exist with the use of thin film technology in making solar cells. That is, efficiencies are often poor. Additionally, film reliability is often poor and cannot be used for extensive periods of time in conventional environmental applications. Often, thin films are difficult to mechanically integrate with each other. These and other limitations of these conventional technologies can be found throughout the present specification and more particularly below.

From the above, it is seen that improved techniques for manufacturing photovoltaic materials and resulting devices are desired.

BRIEF SUMMARY OF THE INVENTION

According to embodiments of the present invention, a method and a structure for forming a photovoltaic cell is provided. More particularly, the present invention provides a method and structure for forming thin film tandem photovoltaic cell. Merely by way of example, embodiments according to the present invention have been implemented using thin film semiconductor material. But it would be recognized that embodiments according to the present invention can have a much broader range of applicability.

In a specific embodiment, a method for fabricating a thin film photovoltaic device is provided. The method includes providing a substrate. The substrate includes an absorber layer and an overlying window layer formed thereon. The method includes loading the substrate into a chamber and subjecting the substrate to a vacuum environment. The vacuum environment has a pressure ranging from 0.1 Torr to about 0.02 Torr in a specific embodiment. A mixture of reactant species derived from diethylzinc species and water species and a carrier gas is introduced into the chamber. The method includes introducing a diborane species using a selected flow rate into the mixture of reactant species. A zinc oxide film is formed overlying the window layer to define a transparent conductive oxide using the selected flow to provide a resistivity of about 2.5 milliohm-cm and less and an average grain size of about 3000 to 5000 Angstroms.

In an alternative embodiment, a method for forming a thin film photovoltaic device is provided. The method includes providing a substrate including a surface region. The method forms a first electrode layer overlying the surface region and forms an absorber material comprising a copper species, an indium species, and a selenide species overlying the first electrode layer. A window layer comprising a cadmium selenide species is formed overlying the absorber material. In a specific embodiment, the method forms a zinc oxide layer characterized by grain size ranging from about a first value to about a second value overlying the window layer using one or more precursor gases. The one or more precursor gases include a zinc species and an oxygen species and a carrier gas in a specific embodiment. The carrier gas includes at least a nitrogen species in a specific embodiment. The method performs at least all or a portion of forming the zinc oxide layer at a temperature of greater than about 200 Degrees Celsius while maintaining a selected flow rate of a gas mixture comprising the zinc species and the oxygen species.

Many benefits can be achieved by ways of the embodiments according to the present invention. For example, the thin film tandem photovoltaic cell can be fabricated using techniques without substantial modification to conventional equipment. Additionally the present thin film photovoltaic cell has an improved conversion efficiency compared to a conventional photovoltaic cell and provides a cost effective way to convert sunlight into electric energy. Depending on the embodiment, one or more of these benefits may be achieved. These and other benefits will be described in more detailed throughout the present specification and particularly below.

DETAILED DESCRIPTION OF THE INVENTION

According to embodiments of the present invention, a method and a structure for forming a photovoltaic cell are provided. More particularly, embodiments according to the present invention provide a method and structure for forming a thin film photovoltaic cell. Merely by way of example, embodiments according to the present invention have been implemented using thin film semiconductor material. But it would be recognized that embodiments according to the present invention can have a much broader range of applicability.

Figure 1:
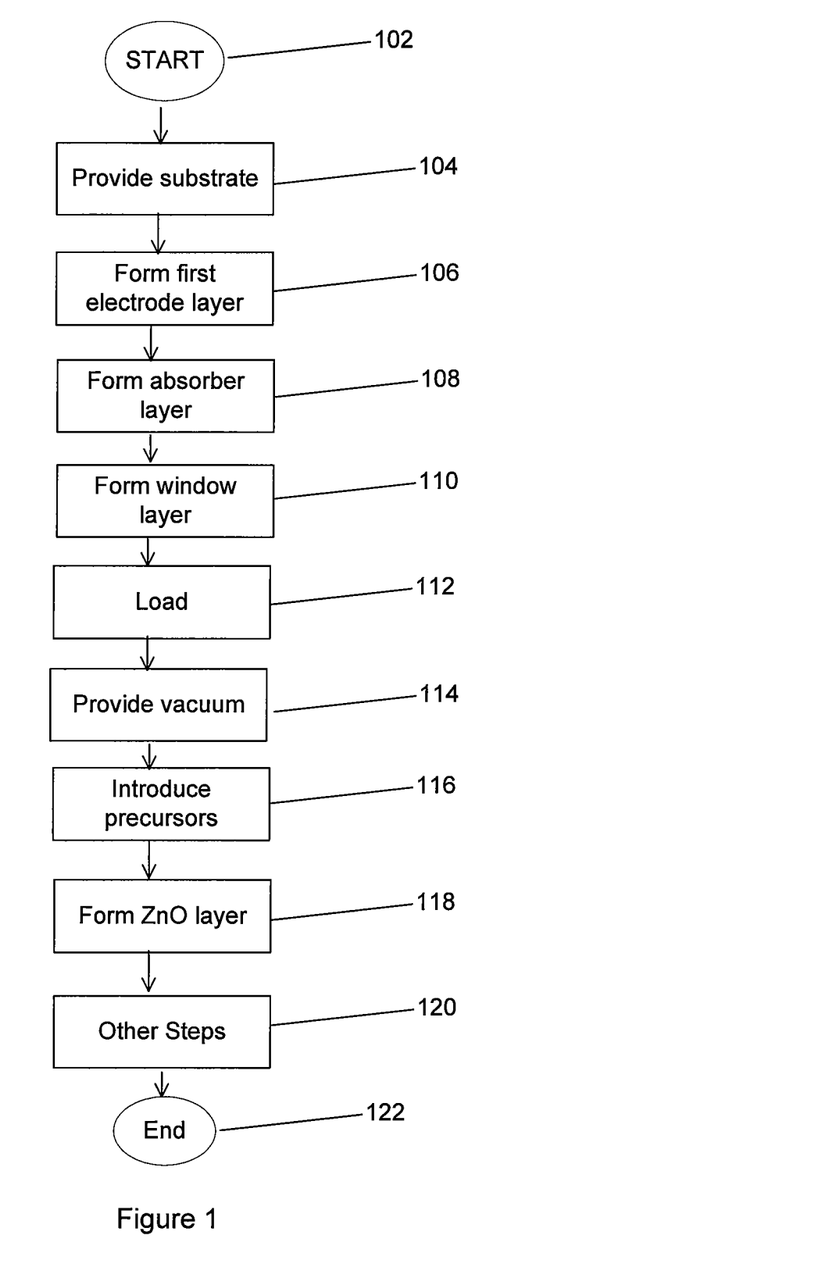
FIG. 1 is a simplified process flow diagram illustrating a method of fabricating a thin film photovoltaic device according to an embodiment of the present invention.

FIG. 1 is a simplified process flow diagram illustrating a method of forming a photovoltaic cell according to an embodiment of the present invention. As shown, the method begins with a Start step (Step 102). A transparent substrate is provided. The transparent substrate can use a glass substrate such as soda lime glass in a specific embodiment. Other transparent substrate materials may also be used. These other transparent substrate material can include fused silica, quartz, and others. A first electrode layer is formed overlying the first surface region of the transparent substrate (Step 106). The first electrode layer can be provided using a molybdenum material in a specific embodiment. Other electrode materials such as transparent conductive oxide material, other metal materials may also be used, depending on the application. The method includes forming an absorber layer overlying the first electrode layer (Step 108) and forming a window layer overlying the absorber layer (Step 110). In a specific embodiment, the absorber layer comprises a CIGS material or a CIS material and the window layer comprises a cadmium sulfide material. In a specific embodiment, the method includes loading the substrate including the transparent substrate with the absorber layer the window layer formed thereon, into a chamber (Step 112). The method subjects the substrate to a vacuum environment (Step 114) and introduces a mixture of reactant species derived from a zinc bearing species and water species and a carrier gas (Step 116). The zinc bearing species can be provided by diethylzinc in a specific embodiment. The method introduces a diborane species using a selected flow rate into the mixture of reactant species in a specific embodiment. In a specific embodiment, a transparent conductive oxide material comprising a zinc oxide material is formed (Step 118) overlying the window layer. The method performs other steps (Step 120) to complete the photovoltaic cell. The method ends with an END step (Step 122). Of course there can be other variations, modifications, and alternatives.

The above sequence of steps provides a method of forming a photovoltaic device according to an embodiment of the present invention. As shown, the method includes a step of forming a transparent conductive oxide layer comprising a zinc oxide material in a specific embodiment The zinc oxide material is preferably characterized by an optical transmission greater than about 99 percent and a resistivity of about 2.5 milliohm-cm and less. Depending on the embodiment, one or more steps may be added, one or more steps may be eliminated, and one or more steps may be performed in a different sequence without departing from the scope of the claims herein. One skilled in the art would recognize other variations, modifications, and alternatives.

Figure 2:
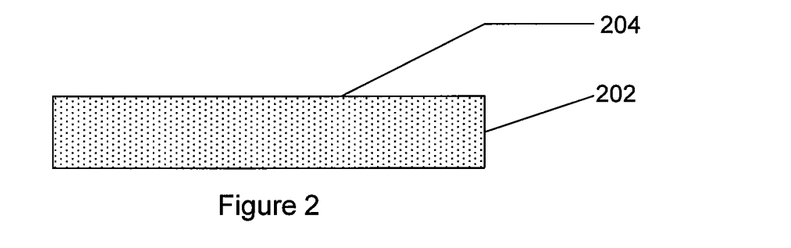
FIG. 2-6 are simplified diagrams illustrating a method of fabricating a thin film photovoltaic device according to an embodiment of the present invention.

FIG. 2-6 are simplified diagrams illustrating a method of forming a thin film photovoltaic device according to an embodiment of the present invention. These diagrams are merely examples and should not unduly limit the claims herein. One skilled in the art would recognize other variations, modifications, and alternatives. As shown in FIG. 2, a transparent substrate member 202 including a surface region 204 is provided. The substrate member can be a glass material such as soda lime glass in certain embodiment. Soda lime glass is a cost effective option for the transparent substrate member. Other suitable transparent substrates such as quartz, fused silica, solar glass can also be used. Each of the transparent substrate can include a barrier layer deposited on a surface region. The barrier layer prevents sodium ions from the glass material to diffuse into photovoltaic material area in a specific embodiment. The barrier layer can be a dielectric material such as silicon oxide deposited using technique such as a sputtering process, a chemical vapor deposition process, including plasma enhanced processes, and others. Other barrier materials may also be used. These barrier materials include aluminum oxide, titanium nitride, silicon nitride, tantalum oxide, zirconium oxide depending on the embodiment.

Figure 3:
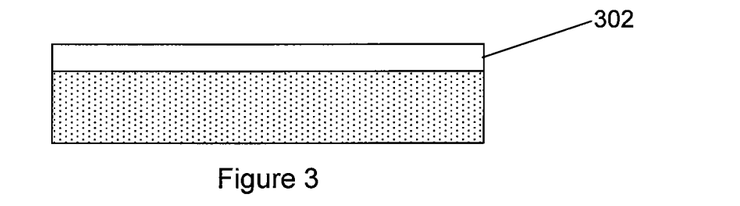

Referring to FIG. 3, the method includes forming a first electrode layer 302 overlying the surface region of the transparent substrate member which can have a barrier layer formed thereon. The first electrode layer may be provided using a transparent conductor oxide (TCO) such as indium tin oxide (commonly called ITO), fluorine doped tin oxide, and the like. In certain embodiments, the first electrode layer may be provided using a metal material. The metal material can be a molybdenum material in a specific embodiment. The molybdenum material can be formed using deposition techniques such as sputtering, plating, physical vapor deposition (including evaporation, sublimation), chemical vapor deposition (including plasma enhanced processes) following by a patterning process. Molybdenum material provides certain advantage over other electrode material for a CIG or CIGS based thin film photovoltaic cells. For example, molybdenum material provides a low contact resistance for CIGS film and stability over subsequent process steps. In a specific embodiment, molybdenum material is formed by depositing a first molybdenum layer overlying the transparent substrate member. The first molybdenum layer has a first thickness and a tensile characteristics in a specific embodiment. A second molybdenum layer having a compression characteristics and a second thickness is formed overlying the first molybdenum layer. In a specific embodiment, the first electrode layer comprising the molybdenum material can be further patterned as shown. Further details of deposition and patterning of the molybdenum material can be found at least in U.S. Provision Application No. 61/101,646 filed Sep. 30, 2008 and U.S. Provision Application No. 61/101,650 filed Sep. 30, 2008, commonly assigned, and hereby incorporate by reference. Of course, there can be other variations, modifications, and alternatives.

Figure 4:
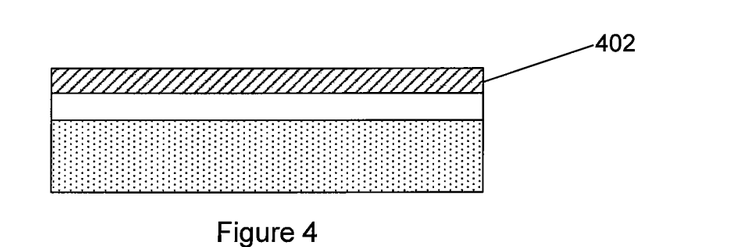

As shown in FIG. 4, the method includes forming an absorber layer 402 overlying a surface region of the first electrode layer. The absorber layer can be a thin film semiconductor material in a specific embodiment. In a specific embodiment, the thin film semiconductor material is a p-type semiconductor material provided by a copper indium disulfide material, or a copper indium gallium disulfide material, or a copper indium diselenide material, or a copper indium gallium diselenide material, any combination of these, or others, depending on the application. Typically, the p-type characteristics may be provided using dopants such as boron or aluminum species. The absorber layer may be deposited by techniques such as sputtering, plating, evaporation including a sulfurization or selenization step. Further details of the formation of the absorber material may be found in Provisional U.S. Patent Application No. 61/059,253, titled "High Efficiency Photovoltaic Cell and Manufacturing Method," commonly assigned, and hereby incorporated by reference.

Figure 5:
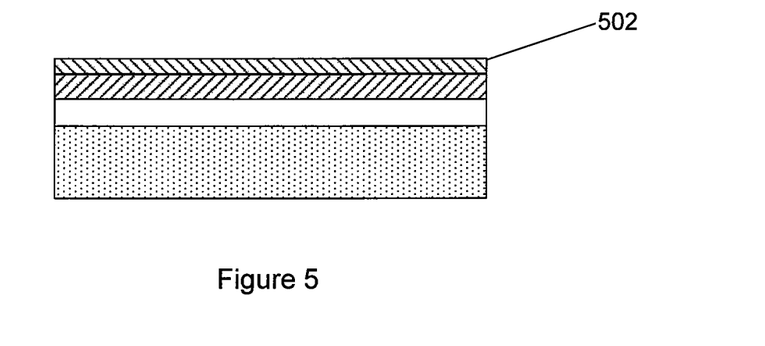

In a specific embodiment, the method forms a window layer 502 overlying a surface region of the absorber layer to form a photovoltaic film stack to provide for a pn junction for the photovoltaic cell. The window layer is often provided using a wide bandgap n-type semiconductor material for a p-type absorber layer in a specific embodiment. In a preferred embodiment, the window layer uses a cadmium sulfide material for a photovoltaic cell using CIGS, CIS and related materials as absorber layer. The window layer can be deposited using techniques such as sputtering, vacuum evaporation, chemical bath deposition, among others.

Figure 6:
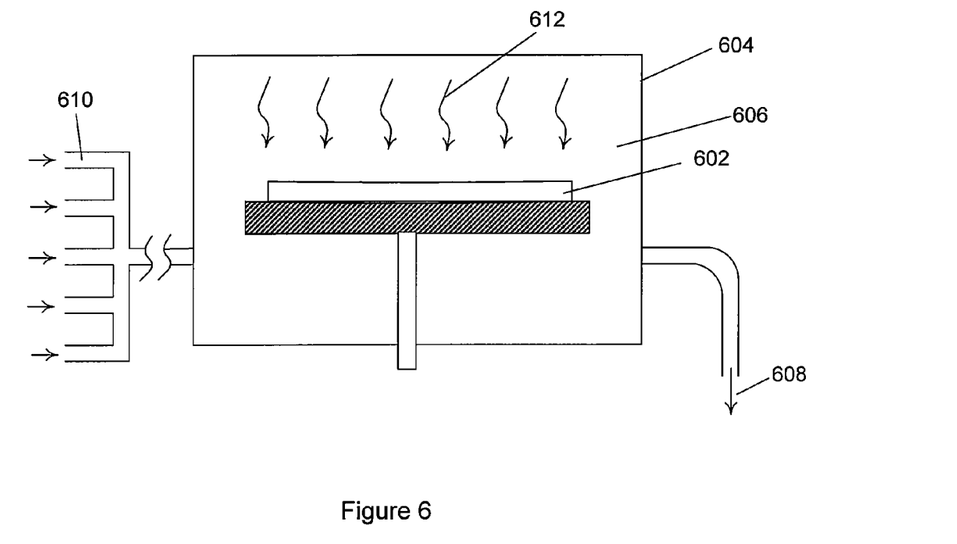

Referring to FIG. 6, the method includes providing a substrate 602. The substrate includes a transparent substrate member having a first electrode layer overlying the transparent substrate member. A thin film absorber layer overlies the first electrode layer and a window layer overlies the thin film absorber layer. As show, the substrate is loaded into a chamber 604. The chamber includes an internal volume 606. The chamber also includes pumping system 608 to provide a suitable vacuum level. As shown, the chamber includes one or more gas lines 610 and various auxiliaries to introduce one or more precursor species for forming a transparent conductive oxide material 614 overlying the window layer in a specific embodiment. The chamber includes one or more heating devices 612 to provide a suitable reaction temperature for the deposition of the transparent conductive material. In a preferred embodiment, the transparent conductive oxide includes a zinc oxide material. Of course there can be other variations, modifications, and alternatives.

Referring again to FIG. 6, the method includes loading the substrate into the chamber. The chamber together with the substrate is pumped down to a pressure ranging from about 0.1 torr to about 0.02 torr in a specific embodiment. A mixture of reactant or precursor species is introduced into the chamber using the one or more gas lines. In a specific embodiment, for the zinc oxide material, the mixture of reactant species can include a diethyl zinc material and a oxygen bearing species provided using a carrier gas. The oxygen bearing species can be water in a specific embodiment. The diethyl zinc material may be provide as a semiconductor grade, or a catalyst grade depending on the embodiment. In a specific embodiment, the water to diethylzinc ratio is greater than about 1 to about 4. In another embodiment, the water to diethylzinc ratio is about 1. In a specific embodiment, the carrier gas can be inert gases such as nitrogen, argon, helium, and the like. In certain embodiment, a boron bearing species derived from a diborane species may also be introduced at a selected flow rate together with the mixture of reactants to form a boron doped zinc oxide material. Other boron bearing species such as boron halides (for example, boron trichloride, boron trifluoride, boron tribromide), or boron hydrohalides may also be used depending on the application. The diborane species is provided at a diborane to diethylzinc ratio of zero percent to about five percent. In a specific embodiment, the diborane ratio to diethylzinc ratio is about one percent. Depending on the embodiment, the chamber can be at a pressure of about 0.5 ton to about 1 ton during deposition of the zinc oxide material. In a specific embodiment, the substrate is maintain at a temperature ranging from about 130 Degree Celsius to about 190 Degree Celsius for the deposition of the zinc oxide material. In an alternative embodiment, the substrate is maintained at a temperature of about 200 Degree Celsius and may be higher. The boron bearing species reduce a resistivity characteristic of the zinc oxide material. Depending on a level of the boron bearing species in the zinc oxide material, the zinc oxide material can have a resistivity of about 2.5 milliohm-cm and less. Further, depending on the level of boron bearing species, the zinc oxide material can have a grain size ranging from about 3000 Angstroms to about 5000 Angstroms to provide a transmission rate of 80 percent or greater and preferably 90 percent and greater for electromagnetic radiation in a wavelength range ranging from about 800 nanometers to about 1200 nanometers. The zinc oxide material can have a hazy appearance in a specific embodiment. Of course there can be other variations, modifications, and alternatives.

While the present invention has been described using specific embodiments, it should be understood that various changes, modifications, and variations to the method utilized in the present invention may be effected without departing from the spirit and scope of the present invention as defined in the appended claims. For example, the zinc oxide material is illustrated using boron as a dopant species. Other dopants such as hydrogen, aluminum, indium, gallium, and the likes may also be used. Additionally, although the above has been generally described in terms of a specific structure for CIS and/or CIGS thin film cells, other specific CIS and/or CIGS configurations can also be used, such as those noted in U.S. Pat. No. 4,612,411 and U.S. Pat. No. 4,611,091, which are hereby incorporated by reference herein, without departing from the invention described by the claims herein. Additionally, embodiments according to the present invention can be applied to other thin film configurations such as those provided by a metal oxide material, a metal sulfide material or a metal selenide material. One of ordinary skill in the art would recognize other variations, modifications, and alternatives.

What is claimed is:

1. A method of forming a zinc oxide film for a photovoltaic device, the method comprising:
    providing a substrate in a deposition chamber, wherein the substrate comprises an absorber layer and an overlying window layer;
    subjecting the deposition chamber to a vacuum pressure ranging from about 0.1 Torr to about 0.02 Torr;
    flowing a zinc-containing precursor and an oxygen-containing precursor into the deposition chamber to form a zinc oxide film over the window layer; and
    flowing a boron-containing precursor into the deposition chamber during the flowing of the zinc-containing precursor.

2. The method of claim 1, wherein the zinc-containing precursor is diethylzinc vapor.

3. The method of claim 1, wherein the oxygen-containing precursor is water vapor.

4. The method of claim 1, wherein the oxygen-containing precursor to zinc-containing precursor ratio is greater than about 1 to about 4.

5. The method of claim 1, wherein the oxygen-containing precursor to zinc-containing precursor ratio is about 1.

6. The method of claim 1, wherein the boron-containing precursor to zinc-containing precursor ratio ranges from about zero to about five percent.

7. The method of claim 1, wherein the boron-containing precursor to zinc-containing precursor ratio is one percent.

8. The method of claim 1, wherein the substrate is maintained at a temperature of about 130 Degrees Celsius to about 190 Degrees Celsius.

9. The method of claim 1, wherein the substrate is maintained at a temperature greater than about 200 Degrees Celsius.

10. The method of claim 1, wherein the zinc oxide film has a transmission rate of 80 percent and greater for electromagnetic radiation having a wavelength of about 800 nanometers to about 1200 nanometers.

11. The method of claim 1, wherein the flowing the precursors increases a pressure of the deposition chamber to about 0.5 to about 1 Torr.

12. A method for forming a thin film photovoltaic device, the method comprising:
   providing a substrate having a first electrode layer, an absorber material overlying the first electrode layer, and a window layer overlying the absorber layer;
   subjecting the deposition chamber to a vacuum pressure ranging from about 0.1 Ton to about 0.02 Torr; and
   forming a zinc oxide layer characterized by grain size ranging from about 3000 Å to about 5000 Å overlying the window layer using one or more precursor gases including a zinc-containing precursor and an oxygen-containing precursor and a carrier gas comprising a nitrogen species.

13. The method of claim 12, wherein the oxygen-containing precursor is derived from water vapor.

14. The method of claim 12, wherein the zinc-containing precursor is derived from diethylzinc.

15. The method of claim 12, wherein the zinc oxide layer is characterized by an optical transmission rate of 99% and greater.

16. The method of claim 12, wherein the substrate is maintained at a temperature of about 130 Degrees Celsius to about 190 Degrees Celsius.

17. The method of claim 12, wherein the substrate is maintained at a temperature greater than about 200 Degrees Celsius.

18. The method of claim 12, further comprising flowing a boron-containing precursor into the deposition chamber during the flowing of the zinc-precursor.

19. The method of claim 18, wherein the boron-containing precursor to zinc-containing precursor ratio ranges from about zero to about five percent.

20. The method of claim 18, wherein the boron-containing precursor comprises diborane.

* * * * *